United States Patent [19]
Morikawa

[11] Patent Number: 6,150,877
[45] Date of Patent: Nov. 21, 2000

[54] SEMICONDUCTOR DEVICE WITH IMPROVED CIRCUIT INTERCONNECTION

[75] Inventor: Yoshinao Morikawa, Nara, Japan

[73] Assignee: Sharp Kabushiki Kaisha, Osaka, Japan

[21] Appl. No.: 09/114,155

[22] Filed: Jul. 13, 1998

[30] Foreign Application Priority Data

Jul. 17, 1997 [JP] Japan ................................ 9-192939

[51] Int. Cl.[7] ................................................. H01L 25/00
[52] U.S. Cl. .......................... 327/565; 326/101; 438/129; 327/293
[58] Field of Search ..................................... 327/291, 293, 327/294, 295, 297, 564, 565; 326/101; 364/489, 490, 491; 438/128, 129

[56] References Cited

U.S. PATENT DOCUMENTS

| 5,394,443 | 2/1995 | Byers et al. ............................. 375/371 |
| 5,465,066 | 11/1995 | Yamashita et al. ...................... 327/294 |

FOREIGN PATENT DOCUMENTS 403196661A  8/1991  Japan .

*Primary Examiner*—Timothy P. Callahan
*Assistant Examiner*—Hai L. Nguyen

[57] ABSTRACT

A semiconductor device includes a first circuit; a second circuit; and a plurality of data paths for transmitting a signal between the first circuit and the second circuit. Signal delay time periods when transmitting a signal through the plurality of data paths are substantially equal with each other.

15 Claims, 5 Drawing Sheets

SEMICONDUCTOR DEVICE WITH IMPROVED CIRCUIT INTERCONNECTION

BACKGROUND OF THE INVENTION

1. Field of the Invention

The present invention relates to a semiconductor device including a plurality of circuits connected to one another.

2. Description of the Related Art

FIG. 3 shows a circuit configuration of a semiconductor device. In the circuit configuration shown in FIG. 3, a signal is transmitted from a first inverter 101 to a second inverter 102. The second inverter 102 is a load for the first inverter 101. The first inverter 101 is a driver for the second inverter 102. A resistance 103 and a parasitic capacitance 104 are present between the first and second inverters 101 and 102. The resistance 103 and the parasitic capacitance 104 are inevitably generated when the inverters 101 and 102 are connected to each other.

FIG. 4 is a timing diagram illustrating signal inputs to and outputs from the first and second inverters 101 and 102. As can be understood from FIG. 4, when a signal 111 is input to the first inverter 101, a signal 112 is output from the first inverter 101. After a delay time period T, a signal 113 is input to the second inverter 102. A signal 114 is output from the second inverter 102. The delay time period T1 represents a delay time period of the entire circuit shown in FIG. 3. In this example, the delay time period T1 is determined based on the time when a signal which is input to or output from the inverter 101 or 102 rises or falls to 50% of the maximum level.

Such a time delay is determined in accordance with, for example, the resistance 103 and the parasitic capacitance 104. The resistance 103 and the parasitic capacitor 104 include, for example, an ON-resistance of an output transistor, a resistance of interconnects, and an input capacitance of an input transistor. Where the resistance 103 is R and the capacitance of the parasitic capacitance 104 is C, the delay time period T is represented by expression (1).

$$T = C \cdot R \quad (1)$$

In the case where the value R of the resistance 103 and the value C of the parasitic capacitance 104 are mostly determined by the interconnect between the first and second inverters 101 and 102, the delay time period T is represented by expression (2) where the length of the interconnect is L, the resistance of the interconnect per unit length is R0, and the capacitance of the interconnect per unit length is C0.

$$T = LR0 \cdot LC0 = L^2 \cdot R0 \cdot C0 \quad (2)$$

As can be understood from expression (2), the delay time period T of the interconnect is influenced by the resistance R connected to the interconnect in series and the capacitance C connected to the interconnect in parallel. Unless the resistance R0 and the capacitance C0 change, the delay time period T is extended as length L of the interconnect is extended.

When such a time delay caused in accordance with the length of the interconnect occurs in, for example, an LSI including multiple-stage circuits, the delay time period is multiplied at each circuit stage. Accordingly, the total delay time period of the entire circuit is excessively long, which prevents the circuit from operating at a higher rate.

In a semiconductor device such as an LSI, an extension in the delay time period caused by an interconnect is significant and the delay time period need be shortened.

Conventionally, in order to lower the resistance of the interconnect, a material having a lower resistance is used for the interconnect, or a multiple-layer interconnect is used to avoid lengthy connections over extended distances and to shorten the required length of the interconnect. However, these solutions raise the cost of the semiconductor device and are not necessarily preferable.

FIG. 5 is an exemplary circuit configuration of a conventional semiconductor device. Such a circuit configuration disadvantageously extends and disperses the delay time period as described below. The circuit configuration shown in FIG. 5 includes a first circuit 121, a plurality of second circuits (six in this example) 122-1 through 122-6 (collectively referred to as "second circuits 122"), a plurality of first interconnects 123-1 through 123-4 (collectively referred to as "first interconnects 123"), a plurality of second interconnects 124-1 through 124-4 (collectively referred to as "second interconnects 124") for respectively connecting the circuits 122-1 through 122-6 to the first interconnects 123-1 through 123-4, and a plurality of third interconnects 125-1 through 125-4 (collectively referred to as "third interconnects 125") for respectively connecting the first circuit 121 to the first interconnects 123-1 through 123-4. The first interconnects 123 are formed by patterning a first conductive layer, and the second interconnects 124 and the third interconnects 125 are formed by patterning a second conductive layer which is different from the first conductive layer. Each first interconnect 123-1 through 123-4 is connected to a respective second interconnect 124-1 through 124-4 and a respective third interconnect 125-1 through 125-4 through contact holes formed in an insulative layer (not shown). The first interconnects 123 have a smaller resistance and a smaller parasitic capacitance per unit length than the second interconnects 124 and the third interconnects 125.

In such a structure, data is transmitted between one of the second circuit 122-1 through 122-6 and the first circuit 121. For example, when data is transmitted between the second circuit 122-1 and the first circuit 121 as shown in FIG. 6, a data path K1 from an output terminal C1 of the second circuit 122-1 to the first circuit 121 is formed. The data path K1 includes one of the second interconnects 124 (represented by reference numeral 124-1), a portion 123a of one of the first interconnects 123 (represented by reference numeral 123-1), and one of the third interconnects 125 (represented by reference numeral 125-1). The data path K1 has at least a resistance and a parasitic capacitance of its own. Since the data path K1 is connected to the second interconnects 124 of the other second circuits 122-2 through 122-6, the parasitic capacitances of the other second circuits 122-2 through 122-6 are applied to the data path K1.

In a similar manner, when one of the other second circuits 122-2 through 122-6 is connected to the first circuit 121, a data path from an output terminal of that second circuit to the first circuit 121 has a resistance and a parasitic capacitance of its own as well as parasitic capacitances of the other second circuits which are connected to a corresponding data path.

The second interconnects 124 and the third interconnects 125 have larger interconnect resistances and larger parasitic capacitances than those of the first interconnects 123. Accordingly, when the total length of the second interconnects 124 and the third interconnect 125 connected to the data path K1 changes, the delay time period also changes.

In the circuit configuration shown in FIG. 5, the second circuits 122-1 through 122-6 are away from the first interconnect 123 by an equal distance. The second interconnect 124-1 is the shortest and connects an output terminal C1 of each of the second circuits 122-1 through 122-6 to the first interconnect 123-1. The lengths of the second interconnects 124 increase in the following order, as can be seen from FIGS. 5 and 6: the second interconnect 124-2 for connecting an output terminal C2 of each of the second circuits 122-1 through 122-6 to the first interconnect 123-2, the second interconnect 124-3 for connecting an output terminal C3 of each of the second circuits 122-1 through 122-6 to the first interconnect 123-3, and the second interconnect 124-4 for connecting an output terminal C4 of each of the second circuits 122-1 through 122-6 to the first interconnect 123-4. Accordingly, second interconnects 124 having different lengths are connected to different first interconnects 123. The length of the second interconnects 124 connected to the data path changes in accordance with which of the first interconnects 123 forms the data path. The delay time period also changes accordingly.

The change in the length of the second interconnects 124 connected to the data path and the accompanying change in the delay time period are determined based on expression (2), as described below.

Referring to FIG. 6, the data path K1 is formed from the output terminal C1 of the second circuit 122-1 to the first circuit 121. As described above, the data path K1 includes the second interconnect 124-1, a portion 123a of the first interconnect 123-1, and the third interconnect 125-1. Where the length of the first interconnect 123-1 is M, the length of the portion 123a is $M_{K1}$, the resistance of the first interconnect 123-1 per unit length is $R0_M$, and the capacitance of the first interconnect 123-1 per unit length is $C0_M$; the delay time period caused by the portion 123a of the first interconnect 123-1 is $M_{K1} \cdot R0_M \cdot M \cdot C0_M$. The sum of length L1 of the second interconnect 124-1 and length L5 of the third interconnect 125-1 is $L_{K1}$. The total length of the second interconnects 124-1 of the second circuit 122-2 through 122-6 which are connected to the data path K1 is L1·5. The resistance of the second interconnects 124 and the third interconnects 125, connected to the data path K1, per unit length is $R0_L$, and the capacitance of the second interconnects 124 and the third interconnects 125, connected to the data path K1, per unit length is $C0_L$. The delay time period caused by the second interconnects 124 and the third interconnects 125 is $L_{K1} \cdot R0_L \cdot (L_{K1}+L1 \cdot 5) \cdot C0_L$. Accordingly, delay time period TA1c1 of the entire data path K1 is represented by expression (3).

$$TA1c1 = M_{K1} \cdot R0_M \cdot M \cdot C0_M + L_{K1} \cdot R0_L \cdot (L_{K1}+L1 \cdot 5) \cdot C0_L \quad (3)$$

The data paths K2, K3 and K4 can be formed respectively from the output terminals C2, C3 and C4 of the second circuit 122-1 to the first circuit 121. Respective delay time periods TA1c2, TA1c3 and TA1c4 are represented by expressions (4), (5) and (6).

$$TA1c2 = M_{K1} \cdot R0_M \cdot M \cdot C0_M + L_{K1} \cdot R0_L \cdot (L_{K1}+L2 \cdot 5) \cdot C0_L \quad (4)$$

$$TA1c3 = M_{K1} \cdot R0_M \cdot M \cdot C0_M + L_{K1} \cdot R0_L \cdot (L_{K1}+L3 \cdot 5) \cdot C0_L \quad (5)$$

$$TA1c4 = M_{K1} \cdot R0_M \cdot M \cdot C0_M + L_{K1} \cdot R0_L \cdot (L_{K1}+L4 \cdot 5) \cdot C0_L \quad (6)$$

where L2, L3 and L4 are lengths of the second interconnects 124-2, 124-3 and 124-4.

The difference among the delay time periods TA1c1, TA1c2, TA1c3 and TA1c4 depends on the difference among the lengths L1, L2, L3 and L4 of the second interconnects 124-1, 124-2, 124-3 and 124-4 from the output terminals C1, C2, C3 and C4 of the second circuit 122-1. Since L1<L2<L3<L4, TA1c1<TA1c2<TA1c3<TA1c4.

As can be understood from this, the total length of the second interconnects 124 connected to each of the data paths K1 through K4 changes in accordance with the output terminal of the second circuit 122-1 from which the data is transmitted, and thus the delay time period also changes. This is applied to the other second circuits 122-2 through 122-6. Since the second interconnect 124-4 from the output terminal C4 is longest, the delay time period is longest when the data is output from the output terminal C4.

In order to shorten the delay time period, the second interconnect 124-4 from the output terminal C4 can be connected to one of the first interconnects 123 which is closer to the first circuit 121. However, this causes one of the other second interconnects 124 to be connected to the first interconnect 123 farther from the first circuit 121. Accordingly, the total delay time period of the circuit configuration is not shortened. Conventionally, accumulation of such delay time periods prevents higher rate operation of the LSIs and other circuits. The non-uniformity among the delay time periods TA1c1, TA1c2, TA1c3 and TA1c4 is not preferable in terms of stability of circuit operation.

SUMMARY OF THE INVENTION

As used herein, the term "groups of second interconnects" refers to all the second interconnects connected to the same first interconnect (for example, a "group of second interconnects" can be all of the 14-1's as shown in FIG. 1).

According to one aspect of the invention, a semiconductor device includes a plurality of first interconnects; a plurality of circuits; and a plurality of second interconnects for connecting the plurality of circuits to the first interconnects. The plurality of second interconnects contains a plurality of groups of second interconnects, each of the plurality of groups of second interconnects being connected to the same first interconnect. A total length of each group of second interconnects is substantially equal to the total length of any other group of second interconnects.

In one embodiment of the invention, each of the plurality of second interconnects is shorter than each of the first interconnects.

In one embodiment of the invention, the first interconnects are arranged substantially in parallel and in different orders in different portions of the semiconductor device.

In one embodiment of the invention, the first interconnects are provided as a result of patterning a first conductive layer, and the second interconnects are provided as a result of patterning a second conductive layer which is different from the first conductive layer.

In one embodiment of the invention, each of the plurality of second circuits are connected to a set of the plurality of second interconnects, each set of the plurality of second interconnects having a substantially equal total length.

In one embodiment of the invention, the semiconductor device is a one-chip integrated circuit.

According to another aspect of the invention, a semiconductor device includes a first circuit; a second circuit; and a plurality of data paths for transmitting a signal between the first circuit and the second circuit. Signal delay time periods when transmitting a signal through the plurality of data paths are substantially equal with each other.

In one embodiment of the invention, the plurality of data paths have a substantially equal length with each other.

In one embodiment of the invention, the plurality of data paths include a first interconnect and a second interconnect connected between the first interconnect and the second circuit. A delay time period caused by the second interconnect per unit length is longer than a delay time period caused by the first interconnect per unit length. The second interconnect is shorter than the first interconnect.

In one embodiment of the invention, the first interconnect and the second interconnect are formed on different conductive layers from each other.

According to the present invention, the plurality of first interconnects are arranged in different orders in different portions of the semiconductor device. Due to such a structure, different portions of each of the first interconnects can be a different distance away from different groups of similarly situated second circuits. Alternatively, different portions of each of the first interconnects can be a different distance away from different second circuits. In other words, the second interconnects connecting the same first interconnect and different second circuits can have different lengths. Such an arrangement allows total lengths of the second interconnects connected to different first interconnects to be substantially equal to one another. In such a structure, regardless of which first interconnect is used for transmitting data, there is no influence caused by the second interconnects, specifically the parasitic capacitances of the second interconnects, on the first interconnect. Thus, the delay time period does not significantly change.

Thus, the invention described herein makes possible the advantage of providing a semiconductor device including circuits operable at a higher rate and having a uniform delay time period among circuits.

This and other advantages of the present invention will become apparent to those skilled in the art upon reading and understanding the following detailed description with reference to the accompanying figures.

DESCRIPTION OF THE PREFERRED EMBODIMENTS

Hereinafter, the present invention will be described by way of illustrative examples with reference to the accompanying drawings.

Figure 1:
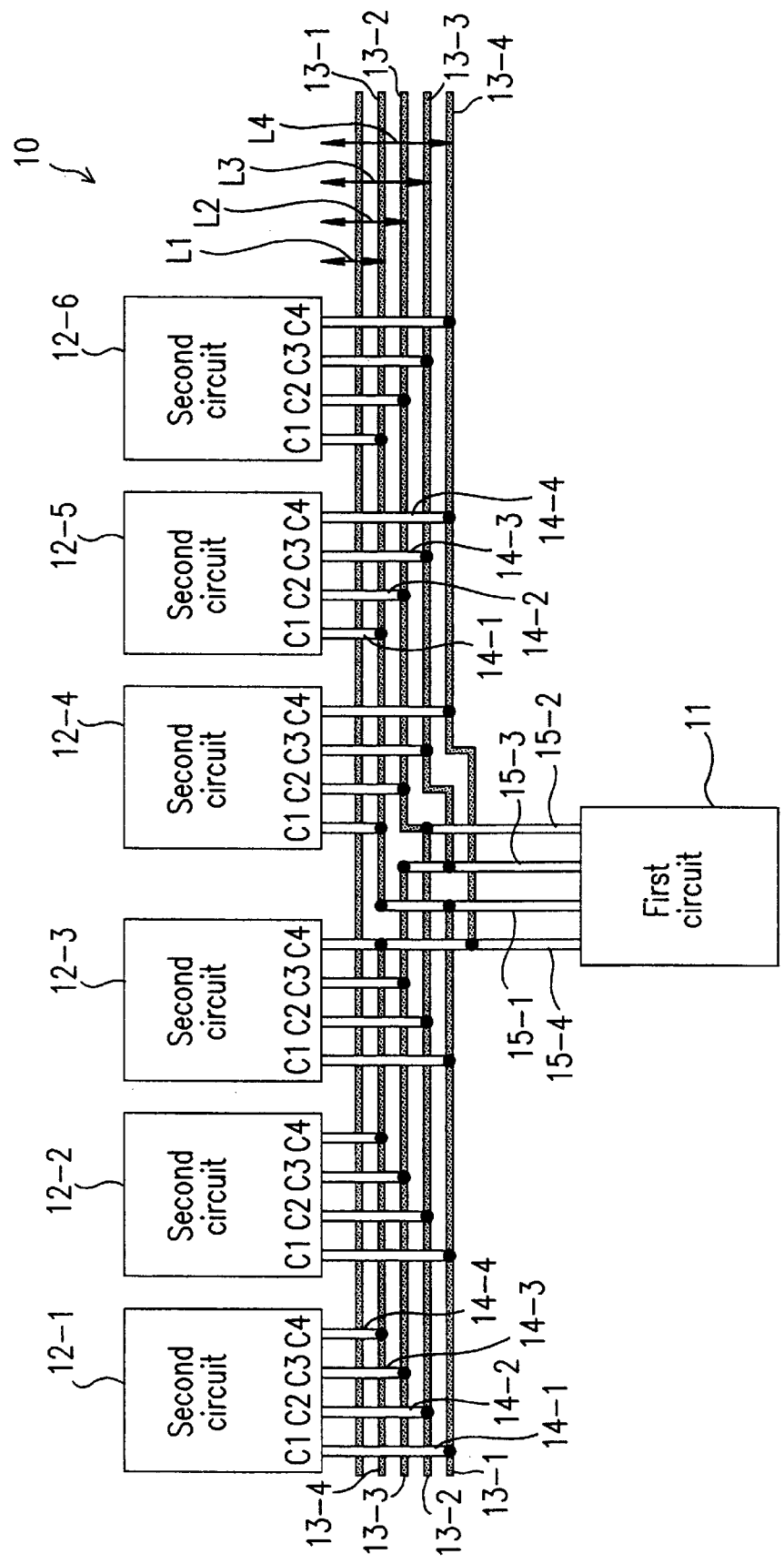
FIG. 1 is a diagram illustrating a circuit configuration of a semiconductor device in an example according to the present invention.

FIG. 1 is a circuit configuration of a semiconductor device 10 in an example according to the present invention. The semiconductor device 10 includes a first circuit 11, a plurality of (six in this example) second circuits 12-1 through 12-6 (collectively referred to as "second circuits 12"), a plurality of first interconnects 13-1 through 13-4 (collectively referred to as "first interconnects 13"), a plurality of second interconnects 14-1 through 14-4 (collectively referred to as "second interconnects 14") for respectively connecting the second circuits 12-1 through 12-6 to the first interconnects 13-1 through 13-4, and a plurality of third interconnects 15-1 through 15-4 (collectively referred to as "third interconnects 15") for respectively connecting the first circuit 11 to the first interconnects 13-1 through 13-4.

The plurality of second circuits 12-1 through 12-6 each have output terminals C1 through C4. Regarding each of the second circuits 12-1 through 12-6, the output terminal C1 is connected to the first interconnect 13-1 through a second interconnect 14-1. The output terminal C2 is connected to the first interconnect 13-2 through a second interconnect 14-2. The output terminal C3 is connected to the first interconnect 13-3 through a second interconnect 14-3. The output terminal C4 is connected to the first interconnect 13-4 through a second interconnect 14-4.

The first interconnects 13 are formed by patterning a first conductive layer. The second interconnects 14 and the third interconnects 15 are formed by patterning a second conductive layer which is different from the first conductive layer. An insulative layer (not shown) is present between the first interconnects 13, and the second interconnects 14 and the third interconnects 15. The first interconnects 13 are connected to the second interconnects 14 and the third interconnects 15 through contact holes formed in the insulative layer.

The first interconnects 13 have a smaller interconnect resistance and a smaller parasitic capacitance per unit length than the second interconnects 14 and the third interconnects 15.

The first interconnects 13 are connected to the first circuit 11 so that the order of the first interconnects 13 to the left of the first circuit 11 in FIG. 1 is different from the order of the first interconnects 13 to the right of the first circuit 11. In other words, the order of the first interconnects is reversed from one side of the first circuit to the other. The first interconnects 13 arranged in this manner are connected to the first circuit 11 through the second interconnects 14 and to the first circuit 11 through the third interconnects 15. Hereinafter, a portion of the semiconductor device 10 to the left of the first circuit 11 will be referred to as the "left portion", and a portion of the semiconductor device 10 to the right of the first circuit 11 will be referred to as the "right portion".

For example, the first interconnect 13-1 is farthest from the second circuits 12-1, 12-2 and 12-3 in the left portion, but closest to the second circuits 12-4, 12-5 and 12-6 in the right portion. The first interconnect 13-4 is closest to the second circuits 12-1, 12-2 and 12-3 in the left portion, but farthest from the second circuits 12-4, 12-5 and 12-6 in the right portion. The first interconnect 13-2 in the left portion is farther away from the second circuits 12-1, 12-2 and 12-3 than the first interconnect 13-2 in the right portion is away from the second circuits 12-4, 12-5 and 12-6. The same analogy also applies to 13-3.

Due to such an arrangement, the second interconnect 14-1 from the output terminal C1 of each of the second circuits 12-1, 12-2 and 12-3 in the left portion is the longest among the four second interconnects 14-1 through 14-4; whereas the second interconnect 14-1 from the output terminal C1 of each of the second circuits 12-4, 12-5 and 12-6 in the right portion is the shortest. In a similar manner, the second interconnect 14-4 from the output terminal C4 of each of the second circuits 12-1, 12-2 and 12-3 in the left portion is the shortest, whereas the second interconnect 14-4 from the output terminal C4 of each of the second circuits 12-4, 12-5 and 12-6 in the right portion is the longest. The second interconnect 14-1 from the output terminal C1 of each of the second circuits 12-1, 12-2 and 12-3 has substantially the same length as that of the second interconnect 14-4 from the output terminal C4 of each of the second circuits 12-4, 12-5 and 12-6. The second interconnect 14-4 from the output terminal C4 of each of the second circuits 12-1, 12-2 and 12-3 has substantially the same length as that of the second interconnect 14-1 from the output terminal C1 of the second circuits 12-4, 12-5 and 12-6.

The second interconnect 14-2 from the output terminal C2 of each of the second circuits 12-1, 12-2 and 12-3 has substantially the same length as that of the second interconnect 14-3 from the output terminal C3 of each of the second circuits 12-4, 12-5 and 12-6. The second interconnect 14-3 from the output terminal C3 of each of the second circuits 12-1, 12-2 and 12-3 has substantially the same length as that of the second interconnect 14-2 from the output terminal C2 of each of the second circuits 12-4, 12-5 and 12-6.

The total length of the second interconnects 14-1 from the output terminals C1 of the second circuits 12-1 through 12-6, the total length of the second interconnects 14-2 from the output terminals C2 of the second circuits 12-1 through 12-6, the total length of the second interconnects 14-3 from the output terminals C3 of the second circuits 12-1 through 12-6, and the total length of the second interconnects 14-4 from the output terminals C4 of the second circuits 12-1 through 12-6 are equal to one another.

Figure 2:
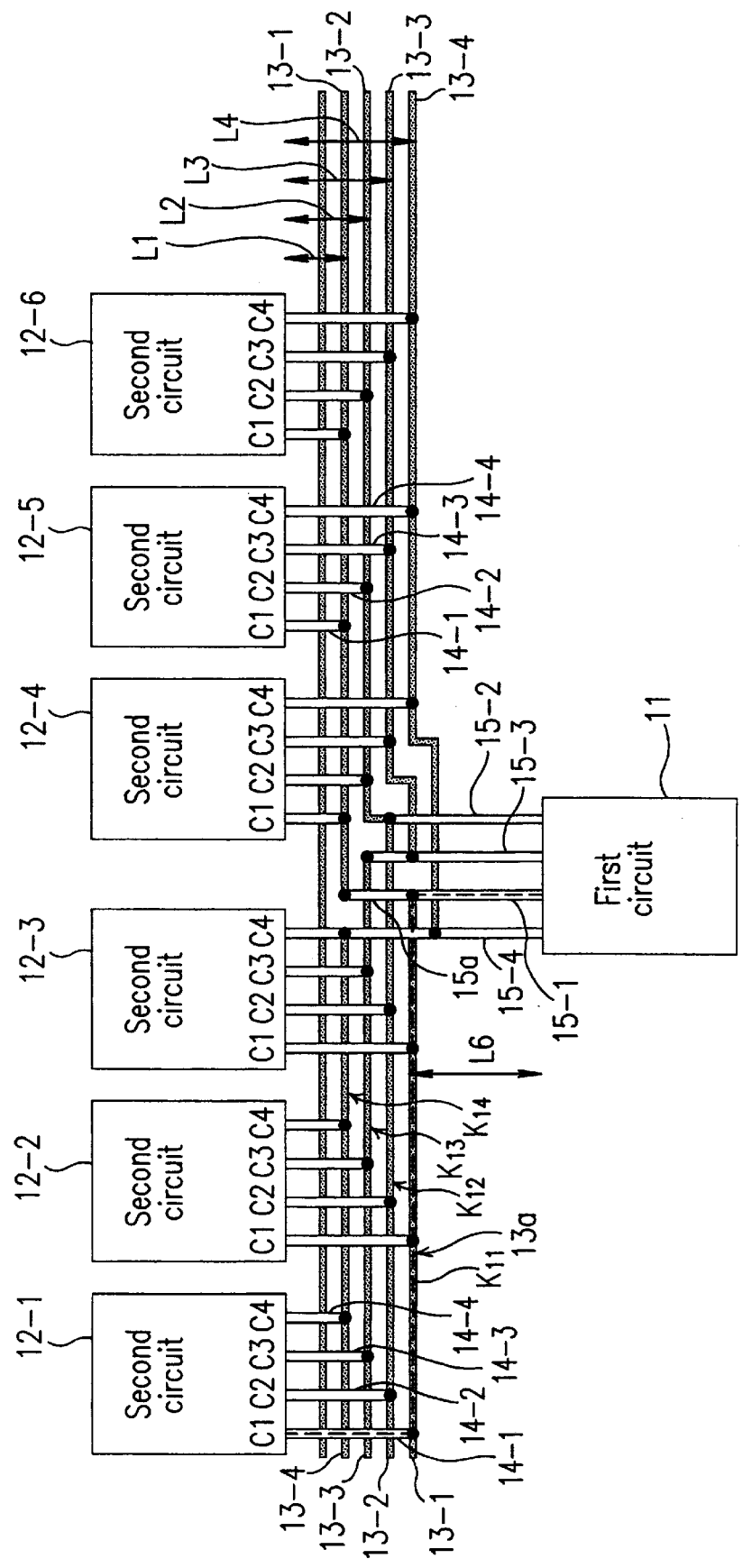
FIG. 2 is a diagram illustrating the circuit configuration shown in FIG. 1, showing an exemplary data path.
Figure 3:
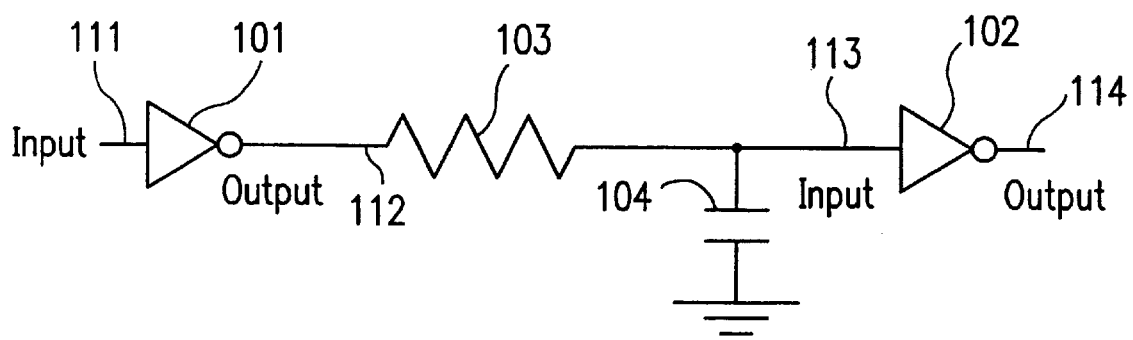
FIG. 3 is a diagram showing a circuit configuration of a semiconductor device.
Figure 4:
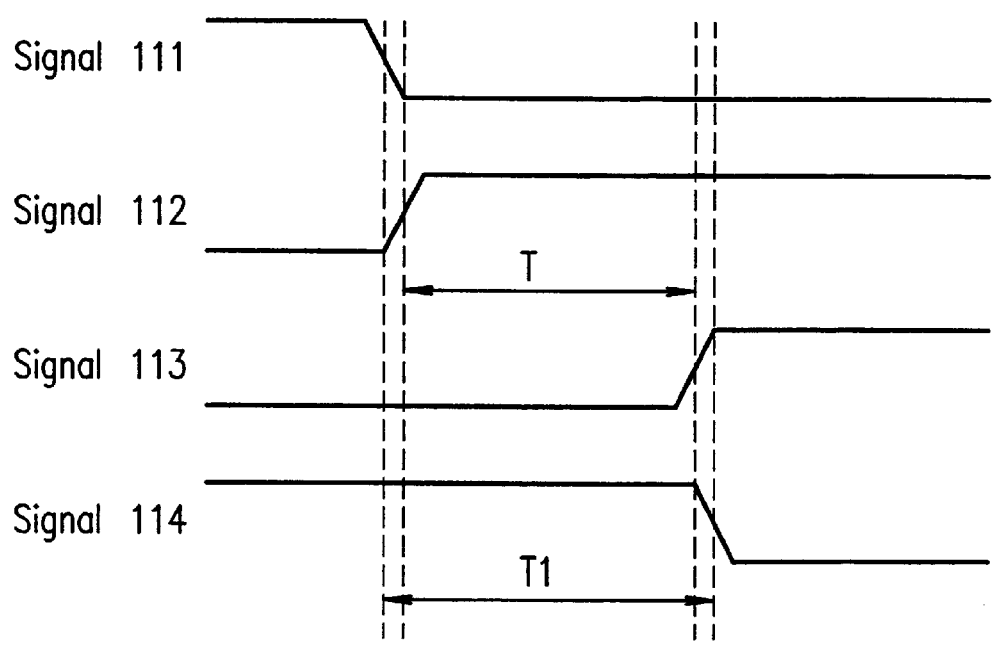
FIG. 4 is a timing diagram illustrating the operation of the circuit shown in FIG. 3.

For example, as shown in FIG. 2, a data path K11 is formed from the output terminal C1 of the second circuit 12-1 to the first circuit 11. The data path K11 includes the second interconnect 14-1, a portion 13a of the first interconnect 13-1, and the third interconnect 15-1 excluding a portion 15a. The portion 15a of the third interconnect 15-1 is connected between the two divided portions of the first line 13-1. The length of the portion 13a included in the data path K11 is $M_{K11}$, the total length of the second interconnect 14-1 and the third interconnect 15-1 included in the data path K11 is $L_{K11}$ (length L4 of the second interconnect 14-1+ length L6 of the third interconnect 15-1 excluding the portion 15a), and the total length of the second interconnects 14-1 of the other second circuits 12-2 through 12-6 connected to the data path K11 is L1·3+L4·2. The delay time period caused by the portion 13a is $M_{K11} \cdot R0_M \cdot M \cdot C0_M$. The delay time period caused by the second interconnect 14-1 and the third interconnect 15-1 included in the data path K11 is $L_{K1} \cdot R0_L \cdot (L_{K11}+L1 \cdot 3+L4 \cdot 2) \cdot C0_L$. Accordingly, the total delay time period UA1c1 caused by the data path K11 is represented by expression (7). In this example, L1, L2, L3 and L4 are respectively the lengths of the second interconnects 14-1, 14-2, 14-3 and 14-4.

$$UA1c1=M_{K11} \cdot R0_M \cdot M \cdot C0_M+L_{K11} \cdot R0_L \cdot (L_{K11}+L1 \cdot 3+L4 \cdot 2) \cdot C0_L \quad (7),$$

where the resistance of the first interconnect 13-1 per unit length is $R0_M$, the capacitance of the first interconnect 13-1 per unit length is $C0_M$, the resistance of the second interconnects 14 and the third interconnects 15 per unit length is $R0_L$, and the capacitance of the second interconnects 14 and the third interconnects 15 per unit length is $C0_L$. The portion 15a of the third interconnect 15-1 is sufficiently shorter than the total length of the second interconnects 14-1 connected between the second circuits 12-2 and 12-3 and the data path K11 (L1·3+L4·2). Thus, the capacitance of the portion 15a is negligible.

Figure 5:
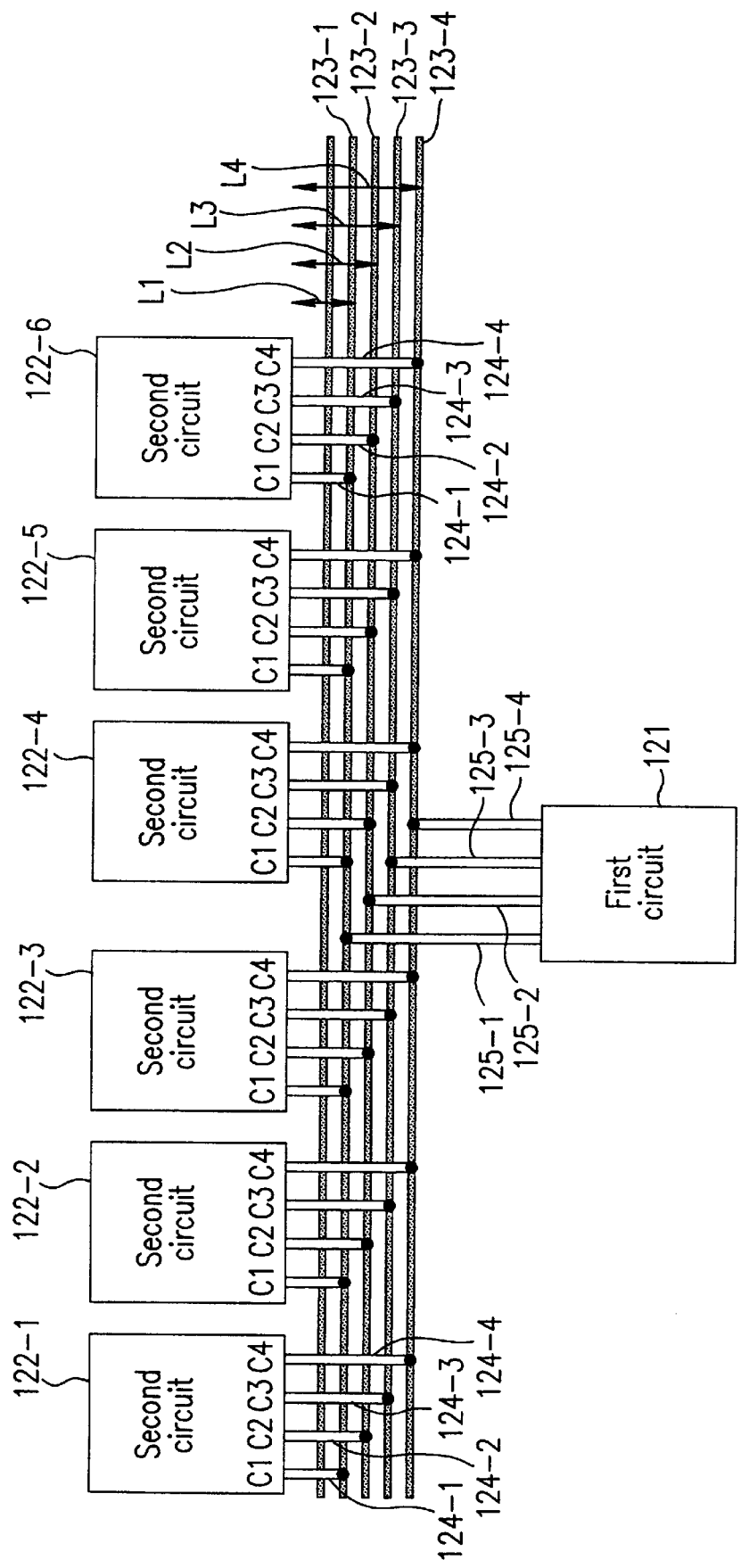
FIG. 5 is a diagram illustrating a circuit configuration of a conventional semiconductor device.
Figure 6:
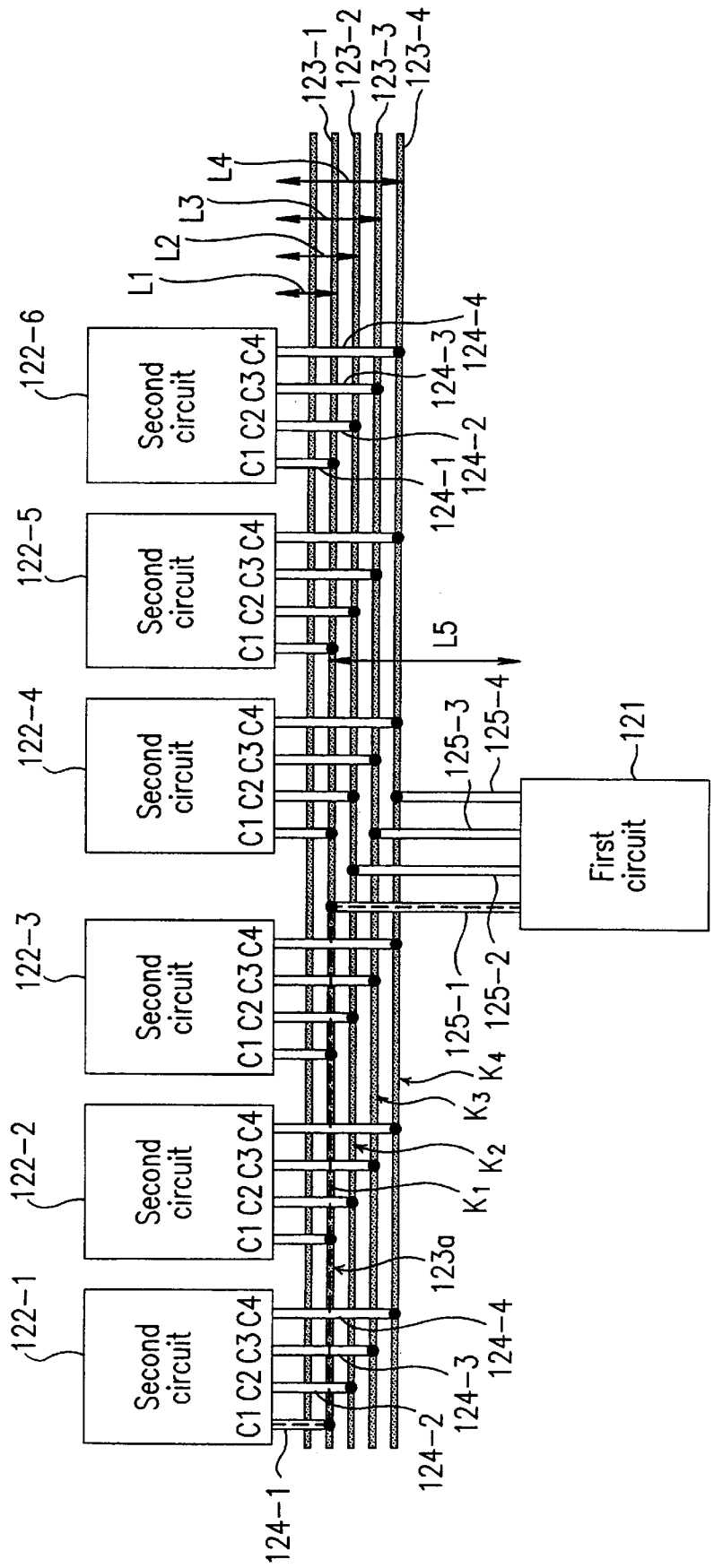
FIG. 6 is a diagram illustrating the circuit configuration shown in FIG. 5, showing an exemplary data path.

The difference between expression (6) representing the maximum delay time period TA1c4 in the conventional circuit configuration in FIG. 5 and expression (7) representing the delay time period UA1c1 in this example is the difference between ($L_{L1}$+L4·5) in expression (6) and ($L_{K11}$+L1·3+L4·2) in expression (7) where $M_{K1} \approx M_{K11}$ and $L_{K1} \approx L_{K11}$. In other words, the expressions (6) and (7) are different in the total length of the second interconnects 14-1 which are not included in the data path K11 but are connected to the data path K11. Since L1<L4, L1·3+L4·2<L4·5. Since $M_{K1} \approx M_{K11}$, the difference between $M_{K1} \cdot R0_M \cdot M \cdot C0_M$ in expression (6) and $M_{K11} \cdot R0_M \cdot M \cdot C0_M$ in expression (7) is negligible. Accordingly, UA1c1<TA1c4.

The data paths K12, K13 and K14 can be formed respectively from the output terminals C2, C3 and C4 of the second circuit 12-1 to the first circuit 11. Respective delay time periods UA1c2, UA1c3 and UA1c4 are represented by expressions (8), (9) and (10).

$$UA1c2=M_{K12} \cdot R0_M \cdot M \cdot C0_M+L_{K1} \cdot R0_L \cdot (L_{K1}+L3 \cdot 2+L2 \cdot 3) \cdot C0_L \quad (8)$$

$$UA1c3=M_{K13} \cdot R0_M \cdot M \cdot C0_M+L_{K1} \cdot R0_L \cdot (L_{K1}+L2 \cdot 2+L3 \cdot 3) \cdot C0_L \quad (9)$$

$$UA1c4=M_{K14} \cdot R0_M \cdot M \cdot C0_M+L_{K1} \cdot R0_L \cdot (L_{K1}+L1 \cdot 2+L4 \cdot 3) \cdot C0_L \quad (10)$$

Regarding the expressions (8), (9) and (10), since L1<L4, L2<L4 and L3<L4, L3·2+L2·3<L4·5, L2·2+L3·3<L4·5, and L1·2+L4·3<L4·5. The lengths of the data paths K11, K12, K13 and K14 are substantially equal to one another; i.e., $M_{K1} \approx M_{K11} \approx M_{K12} \approx M_{K13} \approx M_{K14}$. Accordingly, UA1c2<TA1c4, UA1c3<TA1c4 and UA1c4<TA1c4.

Each of the delay time periods UA1c1, UA1c2, UA1c3 and UA1c4 is shorter than the maximum delay time period TA1c4 in the conventional circuit configuration shown in FIG. 5. Thus, the delay time period is shortened and thus the operating rate is improved.

As described above, the total length of the second interconnects 14-1 from the output terminals C1 of the second circuits 12-1 through 12-6, the total length of the second interconnects 14-2 from the output terminals C2 of the second circuits 12-1 through 12-6, the total length of the second interconnects 14-3 from the output terminals C3 of the second circuits 12-1 through 12-6, and the total length of the second interconnects 14-4 from the output terminals C4 of the second circuits 12-1 through 12-6 are equal to one another. This refers to the fact that the difference among L1·3+L4·2 (expression (7)), L3·2+L2·3 (expression (8)), L2·2+L3·3 (expression (9)) and L1·2+L4·3 (expression (10)) are sufficiently small. Accordingly, regardless of which data path is utilized between the first circuit 11 and the second circuits 12, the circuit operation is stabilized because the delay time periods of the possible data paths are sufficiently uniform.

For example, the ratios of delay time periods UA1c1, UA1c2, UA1c3 and UA1c4 in this example with respect to the delay time periods TA1c1, TA1c2, TA1c3 and TA1c4 in the conventional circuit configuration in FIG. 5 are as follows. As can be understood, the delay time period is shortened according to the present invention.

UA1c1/TA1c1=0.85

UA1c2/TA1c2=0.80

UA1c3/TA1c3=0.82

UA1c4/TA1c4=0.84

The above ratios are obtained under the following conditions. The resistance $R0_M$ of the first interconnects 13 per unit length is 0.1Ω, the capacitance $C0_M$ of the first interconnects 13 per unit length is 0.2 fF, the resistance $R0_L$ of the second interconnects 14 and the third interconnects 15 per unit length is 4Ω, and the capacitance $C0_L$ of the second interconnects 14 and the third interconnects 15 per unit length is 0.7 fF. Furthermore, $M_{K1}$=50 μm, $M_{K11}$=42 μm, $M_{K12}$=55 μm, $M_{K13}$=58 μm, $M_{K14}$=50 μm, M=130 μm, $L_{K1}$=35 μm, L1=7 μm, L2=10 μm, L3=13 μm and L4=16 μm.

Under the same conditions, the ratio of UA1c1:UA1c2:UA1c3:UA1c4 is 1:0.94:0.97:1; and the ratio of TA1c1:TA1c2:TA1c3:TA1c4 is 0.61:0.74:0.87:1. As can be appreciated from the ratios, the delay time periods in this example are more uniform than the delay time periods in the circuit configuration shown in FIG. 5.

The present invention is not limited to the above-described example, and various modifications are possible. For example, the present invention is applicable to a more complicated circuit configuration. As the circuit configuration is more complicated, the resistances and parasitic capacitances of the interconnects are increased. Thus, the effects of the invention become more apparent. For example, Japanese Laid-Open Publication No. 8-321589 discloses that semiconductor devices are isolated from one another without using a LOCOS layer. In this case, the production cost is reduced, but the parasitic capacitance is disadvantageously raised. Such a rise in the parasitic capacitance is prevented by the present invention.

In the above-described example, the first interconnects 13 all have a substantially equal length. Since the resistance and parasitic capacitance of the first interconnects 13 are relatively small, the first interconnects 13 can have slightly different lengths.

In semiconductor devices, a plurality of common circuits are generally connected to a single signal line in a column selector and the like in order to reduce the chip area of an LSI. The present invention provides significant effects in reduction of capacitances and uniformization of delay time periods, when applied to such semiconductor devices.

As described above, according to the present invention, the total lengths of the second interconnects connected to all the first interconnects are substantially equal to one another. Therefore, regardless of which first interconnect is used for transmitting data, there is no influence of the first interconnects on the second interconnect; i.e., there is no influence of the parasitic capacitances of the second interconnects connected to the data path. Thus, the delay time period does not change depending on which data path is formed. Accordingly, the circuit operation is performed more stably and at a higher rate, and the delay time periods in different data paths are made more uniform.

The semiconductor device according to the present invention can be a one-chip integrated circuit.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor device, comprising:
a plurality of first interconnects;
a plurality of circuits; and
a plurality of second interconnects for connecting the plurality of circuits to the first interconnects,
wherein the plurality of second interconnects contains a plurality of groups of second interconnects, each of the plurality of groups of second interconnects being connected to the same first interconnect, and
wherein a total length of each group of second interconnects is substantially equal to the total length of any other group of second interconnects.

2. A semiconductor device according to claim 1, wherein each of the plurality of second interconnects is shorter than each of the first interconnects.

3. A semiconductor device according to claim 1, wherein the first interconnects are arranged substantially in parallel and in different orders in different portions of the semiconductor device.

4. A semiconductor device according to claim 1, wherein the first interconnects are provided as a result of patterning a first conductive layer, and the second interconnects are provided as a result of patterning a second conductive layer which is different from the first conductive layer.

5. A semiconductor device according to claim 1, wherein each of the plurality of circuits are connected to a set of the plurality of second interconnects, each set of the plurality of second interconnects having a substantially equal total length.

6. A semiconductor device according to claim 1, which is a one-chip integrated circuit.

7. A semiconductor device, comprising:
a first circuit;
a plurality of second circuits; and
a plurality of data paths formed by a plurality of first interconnects and a plurality of groups of second interconnects connected between the first interconnects and the plurality of second circuits for transmitting a signal between the first circuit and the plurality of second circuits, wherein each of the plurality of groups of second interconnects are connected to the same first interconnect; and
wherein the total length of each group of second interconnects is substantially equal to the total length of any other group of second interconnects so that signal delay time periods are substantially equal with each other when transmitting a signal through the plurality of data paths.

8. A semiconductor device according to claim 7, wherein the plurality of data paths have a substantially equal length with each other.

9. A semiconductor device according to claim 7, wherein:
a delay time period caused by each second interconnect per unit length is longer than a delay time period caused by each first interconnect per unit length, and
wherein each of the plurality of second interconnects are shorter in length than each of the plurality of first interconnects.

10. A semiconductor device according to claim 9, wherein the plurality of the first interconnects and the plurality of second interconnects are formed on different conductive layers from each other.

11. A semiconductor device, comprising:
a plurality of first interconnects; and
a plurality of groups of second interconnects connecting said plurality of first interconnects to a plurality of circuits, wherein each of said plurality of groups of second interconnects are connected to corresponding ones of said plurality of first interconnects, and wherein the total length of each of said plurality of groups of second interconnects are substantially equal to one another.

12. The semiconductor device of claim 11, wherein said plurality of groups of second interconnects connected to said corresponding ones of said plurality of first interconnects form a plurality of data paths for transmitting signals between a central circuit and selected ones of said plurality of circuits, and wherein signal delay times between said central circuit and any of said plurality of circuits are substantially equal to one another when transmitting signals along said plurality of data paths.

13. The semiconductor device of claim 11, wherein each second interconnect in said plurality of groups of second interconnects is shorter in length than each of said plurality of first interconnects.

14. The semiconductor device of claim 11, wherein said plurality of first interconnects are arranged substantially in parallel, but in different orders on different portions of the semiconductor device.

15. The semiconductor device of claim 11, wherein said plurality of first interconnects and said plurality of groups of second interconnects are formed on different conductive layers from each other.

* * * * *